United States Patent [19]
Malladi

[11] Patent Number: 5,870,310
[45] Date of Patent: Feb. 9, 1999

[54] METHOD AND APPARATUS FOR DESIGNING RE-USABLE CORE INTERFACE SHELLS

[75] Inventor: Srinivasa R. Malladi, San Jose, Calif.

[73] Assignee: LSI Logic Corporation, Milpitas, Calif.

[21] Appl. No.: 642,393

[22] Filed: May 3, 1996

[51] Int. Cl.⁶ .............................. H01L 27/02; H01L 23/50
[52] U.S. Cl. ........................................... 364/490; 364/489
[58] Field of Search ..................... 395/500; 364/488–491

[56] References Cited

U.S. PATENT DOCUMENTS

| | | | |
|---|---|---|---|
| 5,126,726 | 6/1992 | Howard et al. | 340/728 |
| 5,394,473 | 2/1995 | Davidson | 381/36 |
| 5,448,310 | 9/1995 | Kopet et al. | 348/699 |
| 5,473,631 | 12/1995 | Moses | 375/202 |
| 5,506,832 | 4/1996 | Arshi et al. | 370/13 |
| 5,515,107 | 5/1996 | Chiang et al. | 348/473 |
| 5,576,765 | 11/1996 | Cheney et al. | 348/407 |
| 5,576,958 | 11/1996 | Kawakatsu et al. | 364/725 |
| 5,594,789 | 1/1997 | Seazholtz et al. | 379/207 |
| 5,598,352 | 1/1997 | Rosenau et al. | 364/514 A |
| 5,623,311 | 4/1997 | Phillips et al. | 348/396 |
| 5,635,985 | 6/1997 | Boyce et al. | 348/402 |
| 5,638,128 | 6/1997 | Hoogenboom et al. | 348/416 |

OTHER PUBLICATIONS

Jones et al, "A future base Interface from off—the shelf parts", IEEE, pp. 38–41, continue on pp. 84–93, Feb. 1991.

Jim Detar, "LSI Log:6 adds to telecom—specific core library", Eletronic News, p. 25, Sep. 19, 1994.

Freal, Garchner, "LSI eases PCI bus development", Electronic News, p. 197, Aug. 1, 1990.

Joly et al., "Asicintegration relies on reusable cores" Electronic Engineering Times, p. 46, May 1, 1995.

Gwennap, "LSI delivers MPEG decoder for digital TV", p.20, May 10, 1993.

Martin Boliek, *"Real–Time Discrete Cosine Transform Chip Using Generalized Chen Transform Technology,"* pp. 428–431, Ricoh California Research Center, Menlo Park, CA.

Unknown, *"Digital Audio Compression (AC–3),"* T3 review copy of draft ATSC audio standard, Aug. 12, 1994, Doc. T3/251.

Unknown, *"Information Technology–Generic Coding of Moving Pictures and Associated Audio Information: Video,"* ISO/IEC 13818–2, Draft International Standard, Nov. 9, 1994.

Unknown, *"Coding of Moving Pictures and Associated Audio,"* ISO/IEC 13818–3, International Standard, Nov. 11, 1994.

Dave Bursky, *"Single Chip Performs Both Audio and Video Decoding,"* Electronic Design, Apr. 3, 1995.

Unknown, *"Coding of Moving Pictures and Associated Audio for Digital Storage Media At Up To About 1.5 MBIT/s,"* 3–11171 rev. 1, (Part 3 Audio), May 30, 1995.

*Primary Examiner*—Kevin J. Teska
*Assistant Examiner*—Dan Fiul
*Attorney, Agent, or Firm*—Hickman & Martine, LLP

[57] ABSTRACT

Disclosed is a method and apparatus for designing re-useable interfacing logic hardware shells which provide interface functions between a hardware core and one or more busses. An interface logic hardware shell provides previously characterized, tested and implemented interface logic designs for use in future applications with little or no redesign. The hardware circuitry (cells) of which such shells are comprised includes circuitry for bus interface units, memory interface units, buffers, and bus protocol logic. The cores for which the shells provide interface functions include CPU cores, memory cores, digital video decoding cores, digital audio decoding cores, ATM cores, Ethernet cores, JPEG cores and other data processing cores.

28 Claims, 3 Drawing Sheets

METHOD AND APPARATUS FOR DESIGNING RE-USABLE CORE INTERFACE SHELLS

CROSS REFERENCE TO RELATED APPLICATIONS

The following applications are related pending U.S. patent applications: (1) Ser No. 08/642,396 filed on the same day as the instant application, and naming Srinivasa R. Malladi and Venkat Mattela as inventors, and entitled "Micro Architecture of Video Core for MPEG-2 Decoder"; (2) Ser. No. 08/642,520 filed on the same day as the instant application, and naming Srinivasa R. Malladi and Mahadev S. Kolluru as inventors, and entitled "Microarchitecture Of Audio Core For An MPEG-2 And AC-3 Decoder"; and (3) Ser. No. 08/643,185 filed on the same day as the instant application, and naming Srinivasa R. Malladi, Marc A. Miller, and Kwok K. Chau as inventors, and entitled "Method For Partitioning Hardware And Software Tasks In Digital Audio/Video Decoding." These U.S. patent applications are hereby incorporated by reference for all purposes.

BACKGROUND OF THE INVENTION

The present invention relates to integrated circuit (IC) interfacing methods and apparatuses. More specifically, the invention relates to integrated circuit interfacing circuitry that may be reused in multiple applications.

Today's competitive semiconductor companies are constantly having to develop cost reducing manufacturing processes. Large sums of money are invested in the design, integration and testing stages of IC manufacturing. In an effort to reduce the cost of redesigning entire IC designs from scratch, some organizations have implemented an aggressive program designed to create fully tested, and characterized IC designs that may be reused in multiple projects. The IC designs are called "cores," and are employed in, for example, Core Ware® designs of LSI Logic, Corporation ("LSI Logic") of Milpitas, Calif. (the assignee of the present application).

By way of example, a "core" is a hardware layout of a substantially self-contained integrated circuit module for conducting data processing such as a CPU, an Asynchronous Transfer Mode (ATM) unit, a memory unit, a network interface, an audio decoder, a video decoder, etc. The physical core has associated therewith a core design which specifies a collection of mask layouts used to generate the reticles for photolithography steps employed during integrated circuit fabrication. The core design also includes certain processing parameters associated with masks, such as ion implant energy and dose, etch conditions, oxidation conditions, chemical vapor deposition conditions, etc. Still further, the core design includes information specifying the core interface parameters such as the types of input and output signals required, the locations of the various interface connections, etc.

Various cores may be provided in a library such at the CoreWare® library of LSI Logic. Such libraries greatly facilitate design of application specific integrated circuits (ASICs), particularly multi-core systems on a single semiconductor chip (sometimes referred to as "systems on a chip"). A system on a chip may include, for instance, a microprocessor core (i.e., CPU core), a video decoder core, and an audio decoder core: all taken from a CoreWare® library.

Although design costs have been reduced through the implementation of core libraries, an exceedingly large amount of cost, time and effort is spent in integrating the various cores together to form a properly integrated system-on-a-chip. By way of example, when various cores are designed on an IC chip, interface logic including the communication protocols, the timing requirements and the physical interconnections between cores and interface buses must be designed, laid-out, characterized, calibrated, and tested. This process is generally very costly and time consuming.

Even though similar system-on-a-chip designs were created in past applications, a new system-on-a-chip design will generally require engineers to complete the interface logic integration from scratch. This is particularly wasteful where future applications implement similar or substantially similar cores. By way of example, one application may require a Pentium® processor core from Intel Corporation of Santa Clara, Calif. The processor core is then integrated into the chip by provided the appropriate interfacing logic. Interface logic may include the design of bus interface units (BIU) to communicate with CPU buses, integration necessary to connect a CPU co-processor, integration necessary to connect data/instruction cache units, and so on.

As can be appreciated, a substantial amount of resources may be invested in integrating a Pentium® processor core into a prior application. Unfortunately, a future application requiring a different Intel processor core may require integration engineers to march through the entire integration process again. There may also be circumstances where future applications will require slightly different processor cores, but reuse the identical CPU bus, memory bus, and memory cores as in a past application. Although the various components remain the same, conventional processes will require engineers to redesign the entire interface logic from scratch.

In view of the foregoing, it would be desirable to implement a design procedure for reusing a prior application's interface logic in a substantially similar future application in order to reduce the engineering and time expenses associated with redesigning the entire interfacing logic from scratch each time a new system is needed.

SUMMARY OF THE INVENTION

The present invention provides a method and apparatus for designing and using interfacing logic shells. As used herein, a "shell" is an integrated circuit region having selected interface logic that has been previously characterized, tested and implemented in prior applications (i.e., other system chips), and that may be reused in future applications with little or no redesign expense. In another embodiment, a library of shells categorically saves provides shells suitable use with various types of cores and buses. Thus, an integration engineer may refer to the shell library and select a shell suitable for a present IC design and perform the entire integration with little or no redesign.

In one embodiment, a method of designing an integrated circuit is provided. The method steps preferably include at least: (1) providing one or more integrated circuit cores to be formed on an integrated circuit chip; (2) providing at least one bus formed on the integrated circuit chip suitable to link at least a selected integrated circuit core; and (3) integrating an interface logic shell into the integrated circuit chip to provide interfacing logic between the selected integrated circuit core and the at least one bus, the interface logic shell containing the layout for interface logic employed in the integrated circuit and containing substantially the same hardware elements as employed in a previous integrated circuit design.

In another embodiment, an interface logic shell is provided. The Interface logic shell preferably includes hardware for performing interface functions for an integrated circuit hardware core. The interface logic shell will preferably contain substantially the same hardware elements as employed in a previous integrated circuit design, and may form at least one member of a library of interface logic shells that are configured to logically interface between a bus that is external to the interface logic shell and the core that is internal to the interface logic shell.

These and other features and advantages of the invention will be described in more detail below with reference to the drawings.

DETAILED DESCRIPTION OF THE PREFERRED EMBODIMENTS

A. Interface Logic Shells

The present invention provides a method and apparatus for using IC shells having reusable interface logic suitable to provide appropriate interfacing between a multiplicity of integrated circuit cores and buses. The IC shells are preferably designed for one application, stored in an IC shell library, and reused in future applications with little or no time consumed in their redesign, characterization, and testing.

Figure 1:
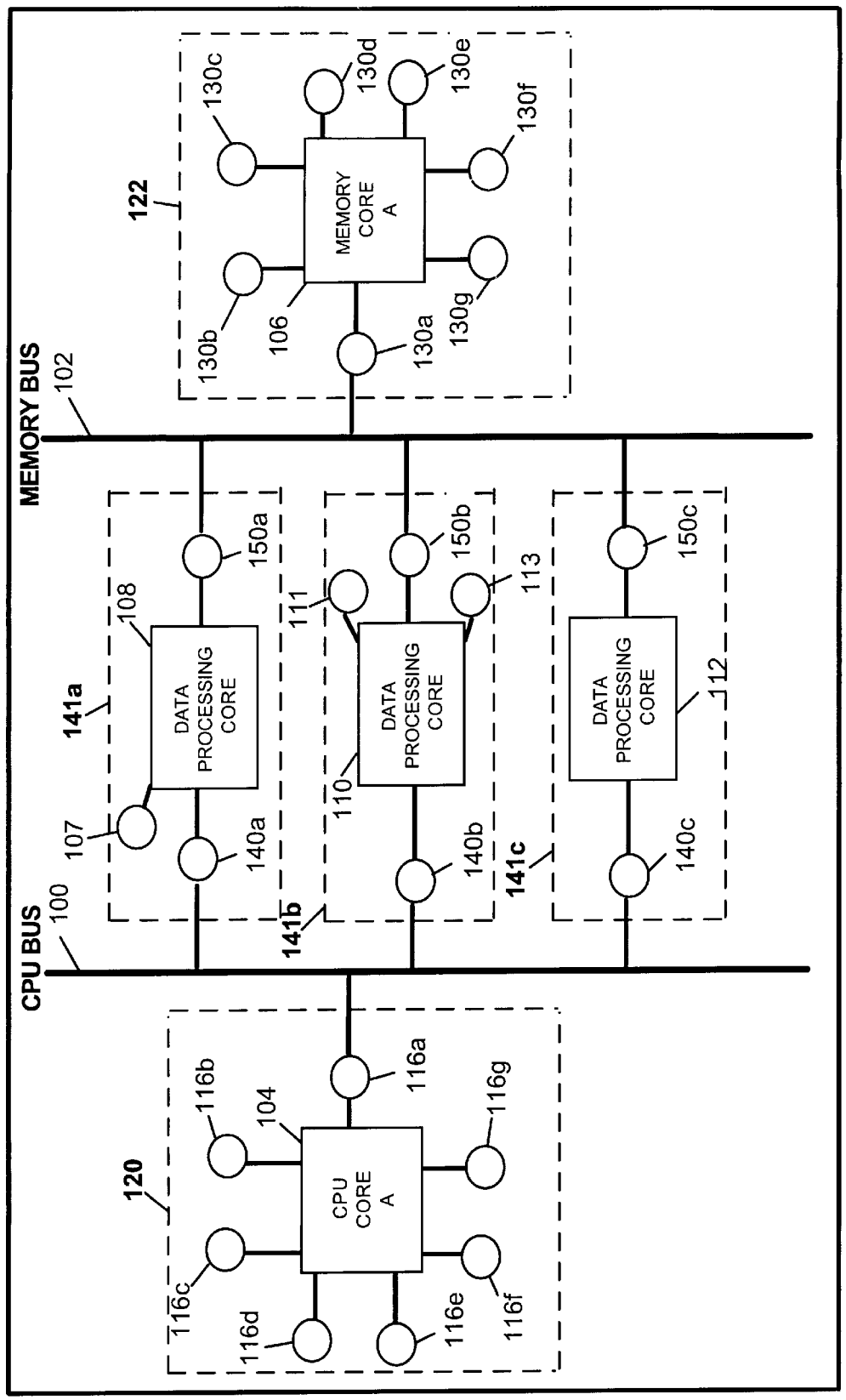
FIG. 1 is diagrammatic perspective of a plurality of interface logic shells having interface logic cells in accordance with a preferred embodiment of this invention.

FIG. 1 illustrates an integrated circuit design labeled as "Application-1." By way of example, Application-1 may be a system-on-a-chip design for digital audio/video decoder. As illustrated, a CPU core (A) 104 is shown connected to a CPU bus 100, and a memory core (A) 106 is shown connected to a memory bus 102. CPU core (A) 104 may be any suitable CPU core, which may include Intel Corporation's Pentium® processors, Motorola's PowerPC™ processors, Sun Microsystem's SPARC™ processors, Silicon Graphics Inc.'s MIPS™ processors, etc. Further, memory core (A) 106 may be any suitable memory core, which may include random access memories (RAMs), dynamic random access memories (DRAMs), static random access memories (SRAMs), etc. In addition, Application-1 may also include a number of data processing cores 108, 110, and 112 suitable for performing computationally intensive processes (e.g., mathematically intensive processing).

In order for CPU core (A) 104 to properly interface with CPU bus 100, a number of interfacing logic cells will be required to establish appropriate communications protocols with CPU bus 100 (e.g., bus interface units (BIUs)). Other necessary interfacing logic may include staging buffers suitable to hold data being transferred to and from CPU bus 100. As is well known in the art, staging buffers vary in size depending on the type of application being performed and the number of IC shells sharing a common bus. In order to streamline the integration of CPU core (A) 104 into Application-1, a CPU shell 120 having the necessary interfacing logic is selected from a shell library.

By way of example, a shell library may include a multiplicity of IC shells having a variety of different interface logic cells suitable to interface with selected cores and buses. In this embodiment, the shell selected from the shell library includes interface logic cells 116*a*–116*g*. Interface logic cells 116*a*–116*g* may include complex interface logic (e.g., BUI's, staging buffers, bus protocols) that has been previously designed, characterized, tested and ascertained to be dependable.

In some cases, where interface logic parameters are strictly prescribed by standards boards (e.g., the American National Standards Institute (ANSI), the International Organization for Standardization (ISO) and the Institute of Electrical and Electronic Engineers (IEEE)), the interface logic differences between applications will be minimal. In these cases, relatively few modifications will be required to integrate the interface logic shells into future applications. Therefore, many interface logic cells will remain substantially unchanged thus reducing the design cost for future applications.

Returning to FIG. 1, once memory core (A) 106 and memory bus 102 are selected for use in Application-1, certain interfacing logic will be required to establish proper operation. To establish proper operation, a memory shell 122 having interface logic cells 130*a*–130*g* will be selected from the aforementioned shell library. Once memory shell 122 is selected, memory core (A) 106 may be overlaid in memory shell 122. Since the selected memory shell 122 has all of the necessary interfacing logic, no modifications will be required to secure proper operation. As can be appreciated, an extremely large amount of time, effort and cost has been saved by employing a previously designed interface logic shell in accordance with this embodiment of the present invention.

In one embodiment, memory interface logic cell 130*a* may represent a memory interface unit (MIU) used to provide memory core (A) 106 with an appropriate level compatibility with memory bus 102. As is well known in the art, MIU's are generally selected to provide proper interfacing between functional cores and buses. Luckily, the most frequently implemented buses have clearly established interface parameters that have been prescribed by industry standards. By way of example, some industry bus standards include: (1) industry standard architecture (ISA), (2) advanced technology industry standard architecture (AT ISA); (3) peripheral component interconnect (PCI), extended industry standard architecture (EISA), microchannel architecture (MCA), etc.

Having standardized buses advantageously provides less variations among the number of required shell interface logic schemes. Therefore, existing shell libraries will be better able to match existing bus interfaces. Although, when existing library shells do not provide the exact interface logic for a particular application, additional interface logic may be added or existing interface logic may be optimized to meet the specific interfacing requirements. As a result, the time and resources spent modifying existing logic will typically only add up to a fraction of the cost of creating the entire interfacing logic from scratch.

Application-1 (of FIG. 1) also shows three data processing shells 141 *a*, 141 *b*, 141*c* having three data processing cores 108, 110, and 112 respectively. Each of the three shells has a number of interfacing logic cells selected to aid the proper reception, transmission and processing of data in and out of the respective shells. In this embodiment, data processing shells 141*a*–141*c* have associated bus interface units (BIUs) 140*a*–140*c* selected to properly interface with CPU bus 100, and memory interface units (MIUs) 150a–150c selected to interface with memory bus 102. For illustration purposes, data processing shell 141b and 141c have additional interface logic cells 107, and 111 and 113 respectively. The additional interface logic cells may represent staging buffers, a local memory blocks, communication protocols, etc. As described above, each associated data processing shell was selected from the shell library, and modifications were made to the selected shell interface logic as necessary.

Figure 2:
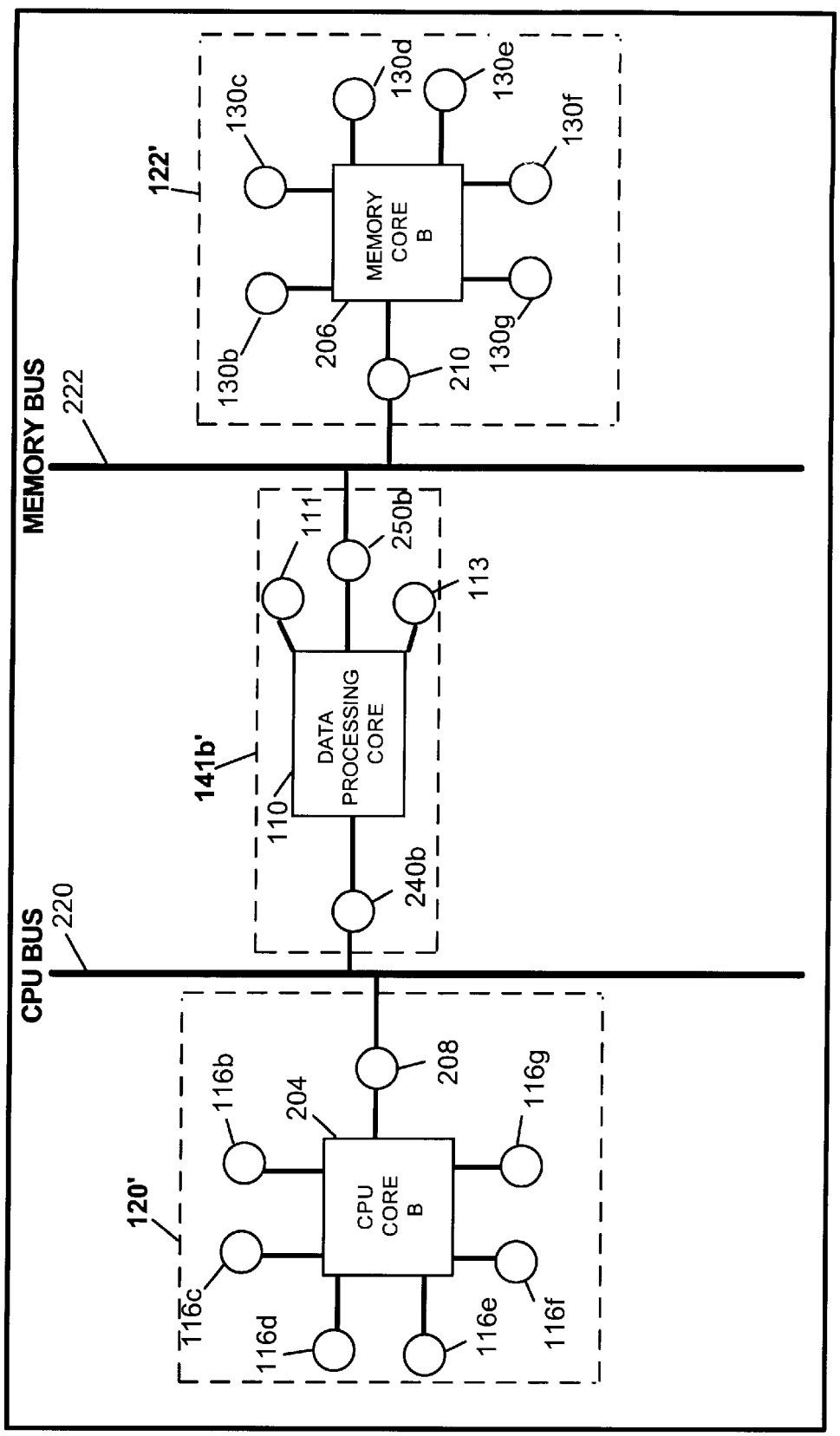
FIG. 2 is a diagrammatic perspective of slightly modified interface logic shells (in comparison to the shells of FIG. 1) used in a new application in accordance with a preferred embodiment of this invention.

FIG. 2 illustrates a integrated circuit design labeled as "Application-2." By way of example, Application-2 may represent a system-on-a-chip design for decoding "high bit-rate" digital video data. Therefore, in order to construct a higher performance system capable of high bit-rate decoding, a CPU core (B) 204, CPU bus 220, memory bus 222 and memory core (B) were used in place of CPU core (A) 104, CPU bus 100, memory bus 102 and memory core (A) of Application-1. Assume further that CPU core 204 is similar to CPU core 104 in that many of the core interface points are similarly located in the two cores. As illustrated, instead of redesigning, re-characterizing and re-testing each and every interface logic cell, previously designed interface logic shells were selected from the shell library. As a result, a CPU shell 120', a data processing core shell 141b' and a memory shell 122' were selected from a shell library. As illustrated, selected shells are shells that were used in Application-1 above.

Although there will be many circumstances where an exact shell meeting every interface logic requirement will be found in the shell library, there will be situations such as the instant case were minor modifications will be required to perform the necessary interfacing. It should also be appreciated that every time a new shell is created, it is added to the shell library thereby generating a richer selection for future reuse.

By way of example, assuming that most of the processing and interface demands for CPU core (B) 204 are substantially similar to those of CPU core (A) 104, only slight modifications to the interface logic of CPU shell 120 will be required (of Application-1) in order to properly interface with CPU bus 220. In this example, only interface logic cell 208 was modified from the interface logic cells of CPU shell 120 of Application-1, leaving interface logic cells 116b–116g unchanged. In this manner, the unchanged interface logic cells may be reused and incorporated into a new shell 120'. In one embodiment, interface logic cell 208 may represent a new bus interface unit (BIU) needed to properly interface between CPU core (B) 204 and CPU bus 220. As can be appreciated, substantial savings may are realized by avoiding redesign of all interface logic cells used in shell 120'. Therefore, the shell library significant reduced the integration costs associated with making simple CPU or bus upgrades.

In a similar fashion, once memory core (B) 206 was selected for Application-2, a memory shell having either the same or substantially the same interface logic requirements was selected from the shell library. In this example, memory shell 122' incorporates interface logic cells 130b–130g of Application-1. Therefore, only interface logic cell 210 needs to be designed to provide optimum interfacing between memory core (B) 206 and memory bus 222. In one embodiment, interface logic cell 210 may represent a memory interface unit (MIU).

Data processing core shell 141b' is also similar to that of Application-1, except that interface logic cells 140b and 150b were replaced with 240b and 250b respectively. Although data processing core 110 did not change from that used in Application-1, the memory and CPU buses changed, thereby requiring different interfacing logic. In any event, interface logic cells 111 and 113 remained the same, which eliminated the expensive process of redesigning and testing those interface logic cells. It should therefore be appreciated that a substantial amount of time and effort is saved by incorporating prior interface logic shells from shell libraries into new applications. Although some applications may require minor changes, the minor changes substantially outweigh the cost of totally redesigning, characterizing and testing each interface logic cell each time a new application is designed.

B. Exemplary Interface Logic Shells

Figure 3:
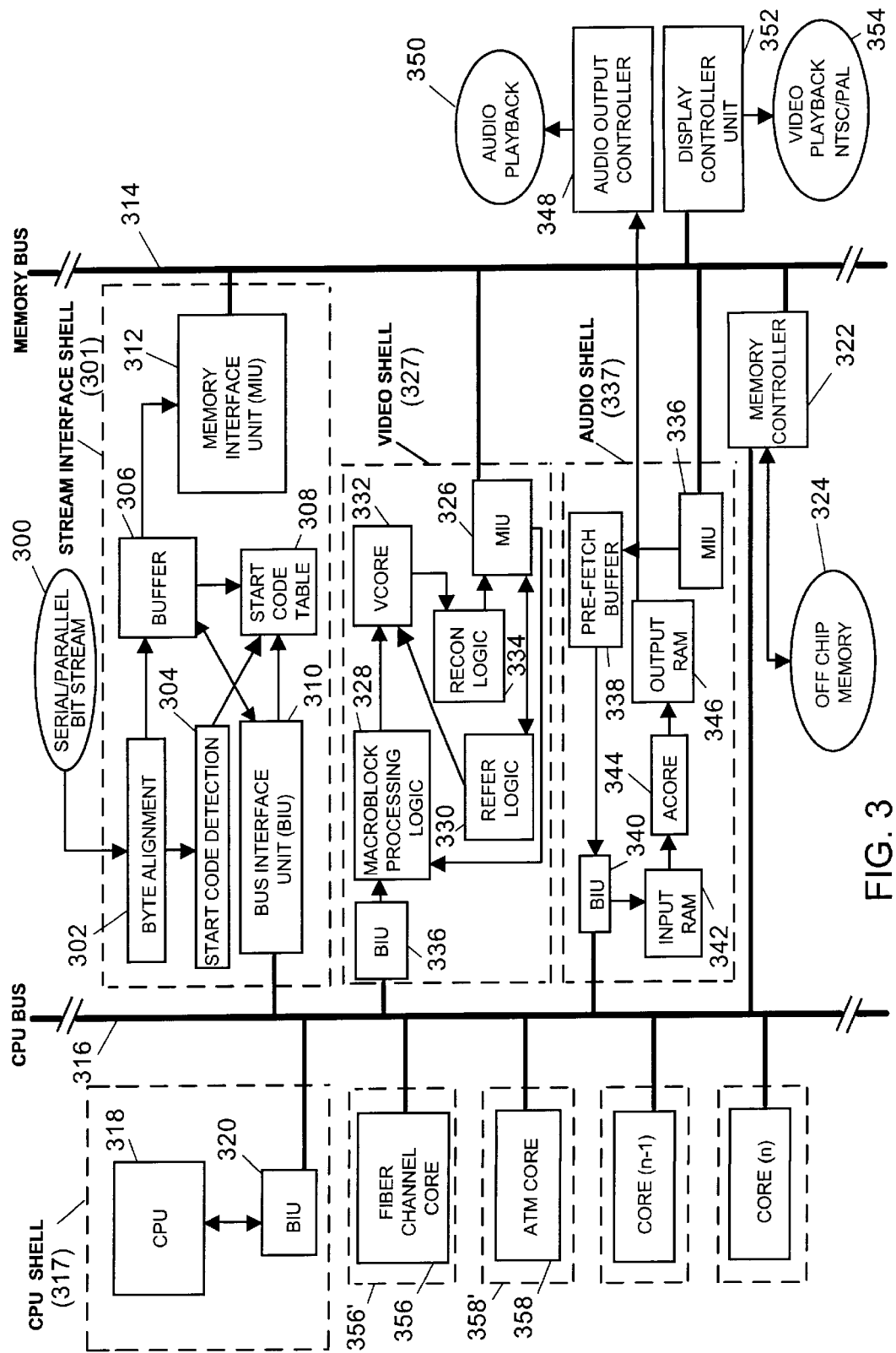
FIG. 3 is a block diagram illustrating the interface logic shells used to decode video and audio data in accordance with a preferred embodiment of this invention.

FIG. 3 is a schematic diagram implementing interface logic shells for an audio and video decoder designed in accordance with one embodiment of this invention. A CPU 318 may communicate with the various interface shells and modules by interconnecting to a CPU BUS 316 through a number of bus interface units (BIUs). Similarly, data may be transferred among the various interface shells, modules and CPU by interconnecting to a MEMORY BUS 314 through a number of memory interface units (MIUs).

In the embodiment shown, four interface shells are provided: a CPU shell 317, a stream interface shell 301, a video shell 327, and an audio shell 337. Each of these shells houses one or more data processing cores, dedicated to specific data processing tasks. In addition, the shells contain various interface logic cells to support the main data processing cores. Generally, shells may be either hardware or software design layouts having the supporting logic and interfaces for cores or other major data processing cores. If such data processing core is substituted from one design to another, the shell may still be used with a minor modification.

For ease of illustration, FIG. 3 will be described with reference to an incoming video bit stream and then with reference to an incoming audio bit stream. In a first example, the process begins when a stream interface shell 301 receives a video bit stream from an external source 300. The raw video data is then preparsed in order to convert the data into machine readable form. The video bit stream may be received serially or in parallel. If the bit stream is received serially, the bit stream will be processed in a hardware block 302 where a byte alignment operation is performed. The byte alignment operation is intended to align the serial bit stream into parallel byte (i.e., 8 bits) size units. As described in the MPEG/Video Document, the bit stream received at block 302 may be a program stream having a video start code, or a bit stream having a packetized elementary stream (PES) header and a payload representing the video bit stream data (e.g., macroblock data) that must be decoded.

In this example, it will be assumed that a PES header and payload has been received by block 302. At this stage, the payload associated with the video bit stream is temporarily stored in a buffer block 306. The PES header is then stored in a start code table 308. In this embodiment, the stored PES header provides the "time stamp" information associated with synchronizing the playback of decoded video data. Once the start code table has the identifying time stamp information, a CPU 318 will periodically poll start code table 308 by communicating through a BIU 320 that is connected to CPU BUS 316, and is connected to a BIU 310 associated with the stream interface shell 301.

In this embodiment, buffer 306 temporarily holds the bit stream payload and start code detection block 304 holds the PES header (i.e., time stamp data). The byte alignment, start code detection, writing to start code, and buffer management functions performed within stream interface shell 301 eliminate the need for the CPU 318 to bit-level processing. By performing these functions in hardware, the CPU need only determine what portion of the bit stream needs to be read for audio-video synchronization (by reading time stamps in the start code table 308). And the CPU can perform this function by polling without requiring an interrupt.

If CPU 318 determines that the time stamp information stored in start code table 308 requires the loading of the video payload stored in buffer 306 into a video interface shell 327, the video payload will be transferred from buffer 306 into a memory interface unit (MIU) 312 that is connected to MEMORY BUS 314. The video payload is then transferred to an MIU 326 in the video interface shell 327. From MIU 326, the video payload is transferred to a macroblock processing logic block 328 where various processing is performed as described in FIG. 1C (steps 122, 123, 124, 126, and 136—including macroblock header processing, motion vector decoding, variable length decoding, and run level decoding).

Before processing by macroblock processing logic 328, the bitstream data is subjected to certain preliminary video decoding steps. After the preliminary decoding steps are performed, the bitstream is processed through macroblock processing logic 328 and then directed into a video core 332 which performs at least some of the following functions: inverse scan, inverse quantization, inverse DCT, half-pel averaging, and a merge operation. For more information on the preliminary decoding steps, macroblock processing logic 328 and video core 332, reference may be made to a related pending U.S. patent application Ser. No. 08/642,396 filed on the same day as the instant application, and previously incorporated herein by reference.

If motion compensation video data is employed (i.e., the currently processed macroblock is a P or a B macroblock), a previously reconstructed macroblock (as opposed to the bitstream) must be retrieved from outside of video shell 327 and provided to MIU 326. In this case, refer logic block 330 will load reference picture information directly into the video core 332.

Once the video core 332 has processed the current macroblock data, the decoded macroblock data is transferred to a recon logic block 334 which determines where to store each reconstructed macroblock and assigns an appropriate memory address in a channel buffer (not shown) located in an off-chip memory block 324. The macroblocks forwarded by recon logic unit 334 pass through MIU 326, and then through memory bus 314 and a memory controller 322 which directs the macroblock to the appropriate address in memory block 324.

In an alternative embodiment, it may be necessary to include a staging buffer (not shown) between MIU 326 and a memory bus 314 to temporarily store reconstructed macroblocks before they are transferred into memory bus 314 and into the memory controller 322, and off-chip memory 324. The staging buffer addresses problems arising when memory bus 314 becomes too busy transferring data from the other interface shells connected to memory bus 314. The staging buffer allows reconstructed data to be transferred to off-chip memory 324 through memory bus 314 when memory bus 314 is free of data traffic.

Video data processed in the video shell is transferred to a display control unit 352, and to a video playback block 354 at an appropriate playback time. Video play back block 354 also determines the appropriate playback rate for the reconstructed video data. If video display is not required until a later time, display control unit 352 will read the reconstructed video data from off-chip memory 324 when it is determined that display is appropriate. As described above, video data is constantly being reconstructed and placed into off-chip memory 324 channel buffer awaiting instructions for display (and possibly motion compensation), and once display is requested, display controller unit 352 calls on the reconstructed video data stored in the off-chip memory 324 and displays it through video display playback 354.

Display controller 352 also performs a number of standard tasks (such as video and on-screen display mix, 4:2:0 to 4:2:2 conversion for display, and color space conversion) which involve display timing and other real-time constraints.

Although a substantial investment of time, cost and effort was employed in designing, characterizing and testing video shell 327, significant costs savings will result when video shell 327 is reused in other applications requiring MPEG video decoding. Therefore, once video shell design 327 has been finalized, it becomes an extremely valuable part of the shell library. In some cases, some interface logic cells of video shell 327 may have to be modified to properly interface within a new application. However, there may also be cases where the video shell may be reused in its entirety. In either situation, significant savings will be realized by not having to design all of the interface logic cells from scratch (e.g., refer logic 330, recon logic 334, etc.).

Assume now that the bit stream data entering the stream interface shell form external source 300 is audio data. As with the video bit stream, it is first determined whether the audio bit stream is being received serially or in parallel. If the audio bit stream is entering the stream interface shell in a serial manner, a byte alignment operation is performed on the bit stream in block 302. The PES header associated with the audio bit stream is then written into start code table 308 and the audio payload is temporarily stored in buffer 306. As described above, the entire bit stream need not be processed by CPU 318, but is merely stored in buffer 306 which frees up CPU bandwidth. CPU 318 may then poll start code table 308 by communicating through BIU 320, CPU bus 316, BIU 310, where it determines whether the audio PES header (i.e., time stamped information) requires the loading of the audio payload into an audio shell. If CPU 318 determines that the audio payload should be loaded into the audio shell, the payload will be transferred from buffer 306 to MIU 312, into memory bus 314, and from there into the audio shell.

On the other hand, if the CPU 318 determines from the PES header that processing of the audio payload stored in buffer 306 is not required at this time, the audio payload may be transferred from buffer 306 into MIU 312, into memory bus 314, into memory controller 322, and into off-chip memory 324 where it is stored in an audio partition. As a result, the audio data is therefore stored in an appropriate memory location off-chip until CPU 318 determines that resources are available for decoding in the audio shell. When CPU 318 determines that loading of audio data into the audio shell is required, CPU 318 will poll the off-chip memory 324 and locate the audio data stored in the audio partition of the channel buffer. This will cause the audio data stored in the channel buffer to be retrieved from off-chip memory 324. Note that the video data, like audio data, may also be temporarily stored in off-chip memory as necessary.

Regardless of whether the audio data is provided from buffer 306 or off-chip memory 324, it will enter the audio shell 337 under the direction of an MIU 336. The audio data is then transferred into a prefetch buffer 338 and then into a BIU 340. The audio data is then transferred to CPU BUS 316 and into BIU 320 for processing by CPU 318. Consequently, the data leaves the interface shell to be processed as firm-ware by CPU 318. In the case of MPEG, this processing involves such steps as processing audio headers, bit allocation, selecting a scale factor index (MPEG Layer II only), decoding scale factors, extracting samples, requantizing samples using the corresponding scale factors, and setting up the audio samples and control registers to an audio core 344. In the case, of AC-3 decoding, the processing involves such steps as processing audio headers, unpacking BSI and side information, decoding exponents, bit allocation, unpacking, ungrouping, dequantizing and dithering mantissas, decoupling, rematrixing (if necessary), dynamic range compression, computing samples, and setting up the audio samples and control registers to an audio core 344.

Once the audio data has been processed by CPU 318, the processed audio data is transferred back to the audio shell through BIU 320, CPU BUS 316 and BIU 340. The resulting audio samples are then loaded into an input RAM 342. The audio samples are then transferred into the audio core 344 where sub-band synthesis and windowing are performed (for MPEG and AC-3 respectively). Note that audio core 344 may perform subband synthesis and windowing for both MPEG and AC-3 samples. For more information on the functions performed in audio core 344, reference may be made to a related pending U.S. patent application Ser. No. 08/642,520 which was previously incorporated by reference.

The windowed audio samples from audio core 344 are then transferred into an output RAM 346 before being transferred to an audio output controller 348. The reconstructed audio data is then transferred to an audio playback block 350.

As illustrated, the above-described audio-video decoder may form part of a larger system-on-a-chip performing multiple functions. These additional functions may be implemented by adding a number of other cores and shells sharing the resources of CPU 318. As shown, these additional cores and shells are connected to CPU BUS 316. By way of example, a fiber channel core 356 and shell 356', an ATM core 358 and shell 358', and a core$_{(n-1)}$ and core$_{(n)}$ and shells may be connected to CPU BUS 316.

Analogous to video shell 327, a substantial investment of time, cost and effort was initially poured into designing, characterizing and testing audio shell 337. However, significant costs savings will be realized when audio shell 337 is reused in other applications requiring audio decoding. Therefore, once audio shell 337 has been finalized, it becomes an extremely valuable asset in the shell library. As described above, some interface logic cells of audio shell 337 may have to be slightly modified to properly interface within other applications. Although, in other applications, audio shell 337 may be reused in its entirety. In either situation, significant savings will be realized by not having to design each and every interface logic cell from scratch (e.g., prefetch buffer 338, input RAM 442, output RAM 446, etc.).

C. Conclusion

Although the foregoing invention has been described in some detail for purposes of clarity of understanding, it will be apparent that certain changes and modifications may be practiced within the scope of the appended claims. Therefore, the present embodiments are to be considered as illustrative and not restrictive, and the invention is not to be limited to the details given herein, but may be modified within the scope of the appended claims.

What is claimed is:

1. A method of designing an integrated circuit, the method comprising the steps of:

providing one or more integrated circuit cores to be fabricated on an integrated circuit chip;

providing at least one bus formed on the integrated circuit chip suitable to link at least a selected integrated circuit core; and integrating an interface logic shell into the integrated circuit chip to provide reusable interfacing logic that has been previously optimized to interface between said selected integrated circuit core that is fabricated on the integrated circuit chip and said at least one bus that is external to the interface logic shell and is formed on the integrated circuit chip, the interface logic shell is optimized with bus protocol logic circuitry and contains a hardware layout for interface logic employed in the integrated circuit chip and containing substantially the same hardware elements as employed in a previous integrated circuit design.

2. The method of designing an integrated circuit as recited in claim 1, wherein the interface logic shell includes at least one buffer circuit.

3. The method of designing an integrated circuit as recited in claim 1, wherein the interface logic shell includes a bus interface unit.

4. The method of designing an integrated circuit as recited in claim 1, wherein the interface logic shell includes a memory interface unit.

5. The method of designing an integrated circuit as recited in claim 1, wherein the interface logic shell includes at least a buffer circuit, a bus interface unit, a memory interface unit, and bus protocol logic.

6. The method of designing an integrated circuit as recited in claim 1, wherein said at least one bus is a memory bus or a CPU bus.

7. The method of designing an integrated circuit as recited in claim 1, wherein the interface logic shell is a member of a library of interface logic shells suitable to interface with selected cores and buses.

8. The method of designing an integrated circuit as recited in claim 1, wherein at least one of the integrated circuit cores is selected from the group consisting of a CPU core, an ATM core, a video decodercore, an audio decoder core, an ethernet core, and a JPEG core.

9. A method of designing an integrated circuit, the method comprising the steps of:

providing one or more integrated circuit cores means to be fabricated on an integrated circuit chip;

providing at least one bus means formed on the integrated circuit chip suitable to link at least a selected integrated circuit core means; and integrating an interface logic shell means into the integrated circuit chip to provide reusable interfacing logic means that has been previously optimized to interface between said selected integrated circuit core means that is fabricated onto the integrated circuit chip and said at least one bus means that is external to the interface logic shell means and is formed on the integrated circuit chip, the interface logic shell is optimized with bus protocol logic circuitry and contains a hardware layout for interface logic means employed in the integrated circuit and containing substantially the same hardware elements as employed in a previous integrated circuit design.

10. The method of designing an integrated circuit as recited in claim 9, wherein the interface logic shell means includes at least one buffer circuit.

11. The method of designing an integrated circuit as recited in claim 9, wherein the interface logic shell means includes a bus interface means.

12. The method of designing an integrated circuit as recited in claim 9, wherein the interface logic shell means includes a memory interface means.

13. The method of designing an integrated circuit as recited in claim 9, wherein the interface logic shell means includes at least a buffer means, a bus interface means, a memory interface means, and bus protocol logic means.

14. The method of designing an integrated circuit as recited in claim 9, wherein said at least one bus means is a memory bus means or a CPU bus means.

15. The method of designing an integrated circuit as recited in claim 9, wherein the interface logic shell means is a member of a library of interface logic shell means suitable to interface with selected core means and bus means.

16. The method of designing an integrated circuit as recited in claim 9, wherein at least one of the integrated circuit core means is selected from the group consisting of a CPU core, an ATM core, a video decoder core, an audio decoder core, an ethernet core, and a JPEG core.

17. An interface logic shell including hardware for performing interface functions, the interface logic shell comprises:
   a reusable bus interface circuit being physically contained within the interface logic shell, the reusable bus interface circuit is optimized to interface with a CPU bus that is external to the interface logic shell;
   a reusable memory interface circuit being physically contained within the interface logic shell, the reusable memory interface circuit is optimized to interface with a memory bus that is external to the interface logic shell;
   at least one reusable integrated circuit hardware core being integrated into the interface logic shell, the at least one reusable integrated circuit hardware core being electrically interconnected with the reusable bus interface circuit and the reusable memory interface circuit; and
   wherein said interface logic shell contains substantially the same hardware elements as employed in a previous integrated circuit design.

18. The interface logic shell as recited in claim 17, wherein said interface logic shell includes at least one buffer circuit.

19. The interface logic shell as recited in claim 17, wherein said interface logic shell includes bus protocol logic.

20. The interface logic shell as recited in claim 17, wherein said interface logic shell forms one member of a library of interface logic shells that are configured to logically interface between a bus that is external to said interface logic shell and said at least one reusable integrated circuit hardware core that is internal to said interface logic shell.

21. The interface logic shell as recited in claim 20, wherein said interface logic shell contains logic suitable to establish an interfacing link between said at least one reusable integrated circuit hardware core and said CPU bus.

22. The interface logic shell as recited in claim 20, wherein said interface logic shell contains logic suitable to establish an interfacing link between said at least one reusable integrated circuit hardware core and said memory bus.

23. An interface logic shell including hardware means for performing interface functions, the interface logic shell comprises:
   a reusable bus interfacing means that is physically contained within the interface logic shell the reusable bus interfacing means is optimized to interface with a CPU bus that is external to the interface logic shell;
   a reusable memory interfacing means that is physically contained within the interface logic shell, the reusable memory interfacing means is optimized to interface with a memory bus that is external to the interface logic shell;
   at least one reusable integrated circuit core being integrated into the interface logic shell, the at least one reusable integrated circuit hardware core being electrically interconnected with the reusable bus interfacing means and the reusable memory interfacing means; and
   wherein said interface logic shell contains substantially the same hardware element means as employed in a previous integrated circuit design.

24. The interface logic shell as recited in claim 23, wherein said interface logic shell includes at least one data buffering means.

25. The interface logic shell as recited in claim 23, wherein said interface logic shell includes bus protocol logic means.

26. The interface logic shell as recited in claim 23, wherein said interface logic shell forms one member of a library of interface logic shells that are configured to logically interface between a bus means that is external to said interface logic shell and said at least one reusable integrated circuit core that is internal to said interface logic shell.

27. The interface logic shell as recited in claim 26, wherein said interface logic shell contains logic means suitable to establish an interfacing link between said at least one reusable integrated circuit hardware core and said CPU bus.

28. The interface logic shell as recited in claim 26, wherein said interface logic shell contains logic means suitable to establish an interfacing link between said at least one reusable integrated circuit hardware core and said memory bus.

* * * * *